(12) United States Patent
Woersinger et al.

(10) Patent No.: US 7,637,176 B2
(45) Date of Patent: Dec. 29, 2009

(54) BASE DESIGN FOR SELF-CENTERING

(75) Inventors: Juergen Woersinger, Maulbronn (DE); Martin Mast, Gerlingen (DE); Andreas Stratmann, Gomaringen (DE); Richard Muehlheim, Tuebingen (DE); Regina Grote, Reutlingen (DE); Hans-Juergen Spiegel, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 463 days.

(21) Appl. No.: 10/558,570

(22) PCT Filed: Apr. 20, 2004

(86) PCT No.: PCT/DE2004/000822

§ 371 (c)(1),
(2), (4) Date: Sep. 6, 2006

(87) PCT Pub. No.: WO2004/109237

PCT Pub. Date: Dec. 16, 2004

(65) Prior Publication Data
US 2007/0056397 A1  Mar. 15, 2007

(30) Foreign Application Priority Data
May 28, 2003  (DE)  ................... 103 24 220

(51) Int. Cl.
*G01D 21/00* (2006.01)

(52) U.S. Cl. ........................... 73/866.5

(58) Field of Classification Search ............... 220/612, 220/622; 73/866.5
See application file for complete search history.

(56) References Cited

U.S. PATENT DOCUMENTS

| 1,228,357 | A | * | 5/1917 | Domoto ............... 220/611 |
| 3,327,892 | A | * | 6/1967 | Lloyd et al. ............ 220/612 |
| 4,131,088 | A | | 12/1978 | Reddy |
| 4,285,003 | A | | 8/1981 | Gaicki |
| 4,796,365 | A | * | 1/1989 | Hudson ................ 33/356 |
| 5,029,120 | A | | 7/1991 | Brodeur et al. |
| 5,427,268 | A | * | 6/1995 | Downing et al. ....... 220/581 |
| 5,948,992 | A | | 9/1999 | Yamamoto |
| 6,255,942 | B1 | * | 7/2001 | Knudsen ............... 340/506 |
| 6,971,849 | B2 | * | 12/2005 | Saito et al. ............ 415/215.1 |

FOREIGN PATENT DOCUMENTS

DE    199 19 112    11/2000

* cited by examiner

Primary Examiner—Robert R Raevis
(74) Attorney, Agent, or Firm—Kenyon & Kenyon LLP

(57) ABSTRACT

A device having at least one housing and one bottom connected to the housing. In this context, the housing has a housing wall and the bottom at least one base. Further it is provided for the base to have a specifiable edge. The essence of the present arrangement now lies in the fact that the edge of the base has at least two regions, a first region being situated closer to the housing wall and a second region being further removed from the housing wall.

19 Claims, 2 Drawing Sheets

BASE DESIGN FOR SELF-CENTERING

FIELD OF THE INVENTION

The present invention starts out from a device and a method for manufacturing the device in which at least one housing and one bottom connected to the housing are designed in such a way that the housing has a housing wall and the housing bottom has at least one base.

BACKGROUND INFORMATION

The edge of the base is designed in such a way that it has at least two regions, a first region being situated closer to the housing wall and the second region being further removed from the housing wall. A device in which a pressure sensor having a base is situated in a pressure sensor housing is already known from the patent document German Published Patent Application No. 199 19 112.

SUMMARY OF THE INVENTION

The present invention starts out from a micromechanical device having at least one housing and one floor connected to the housing. In this instance, the housing has a housing wall and the bottom at least one base. Further it is provided for the base to have a specifiably designed edge. The essence of the present invention now lies in the fact that the edge of the base has at least two regions, a first region of the edge being situated closer to the housing wall and a second region of the edge being further removed from the housing wall.

It is especially advantageous if the edge of the base alternately is made up of the first and the second region. In this instance it is provided in particular for the base to have in each instance eight first and second regions. A further refinement of the present invention provides for the regions to be arranged for example symmetrically distributed over the edge with respect to the center of the base.

According to the present invention, a first region is made up of a ridge, an angle, a corner or a point on the edge of the base. By contrast, the second region represents a flat surface or a rounded surface with respect to the housing wall on the edge of the base.

A preferred refinement of the present invention provides for the contact between the housing wall and the base to occur only in one region. This may be achieved, for example, in that only the first region has a contact. Furthermore it is possible that not every first region on the base has a contact to the housing wall. Moreover, it may be provided for the base to be designed as a centering base, which can allow for a centering of the housing on the housing bottom. Apart from an electrical contact between the housing wall and the base, a thermal contact may also be considered.

The development of the base on the housing bottom advantageously provides for a gap between the base and the housing wall at least in the second region. In a special refinement of the present invention, a filling material is provided in this gap, which completely fills the gap. In addition there is a provision for the gap between the edge of the base and the housing wall to be filled at least partially with the filling material. Furthermore it is provided for a passivating substance to be used as filling material.

It is particularly advantageous if the first and the second region of the edge of the base are designed in such a way that a filling of the gap designed as a filling region between the edge of the base and the housing wall is achieved with a minimum of inclusions of air and/or hollow spaces in the filling material. For this purpose, the design of the first and second region of the edge of the base may be varied beyond the dimensions of the two regions. Another possibility for minimizing the inclusions is to coordinate the succession of the first and the second region appropriately.

The present invention provides for the filling material between the edge of the base and the housing wall to be entered at least up to the height of the base. Moreover there may be a provision for parts of the upper side of the base to be covered by the filling material as well. This may be advantageous for example for fixing the contacts of a sensor element.

In a further development of the present invention, the bottom has at least one sensor element, which detects an operating variable representing at least one operating parameter of a medium adjoining the sensor element and/or a state parameter of the sensor element. For this purpose, it is particularly provided for the sensor element to be located in the region of the base. If operating parameters of a medium are detected, then there is a provision for the sensor element to be exposed to the medium. Thus a pressure and/or a pressure difference and/or a temperature and/or a density and/or a flow velocity of the medium may be detected. If a state variable of the sensor element is to be detected, then a direct contact with a medium surrounding the sensor element is not necessary. State variables such as, for example, a velocity and/or an acceleration and/or a rotation can thus be detected directly by the sensor element.

DETAILED DESCRIPTION

Figure 1:
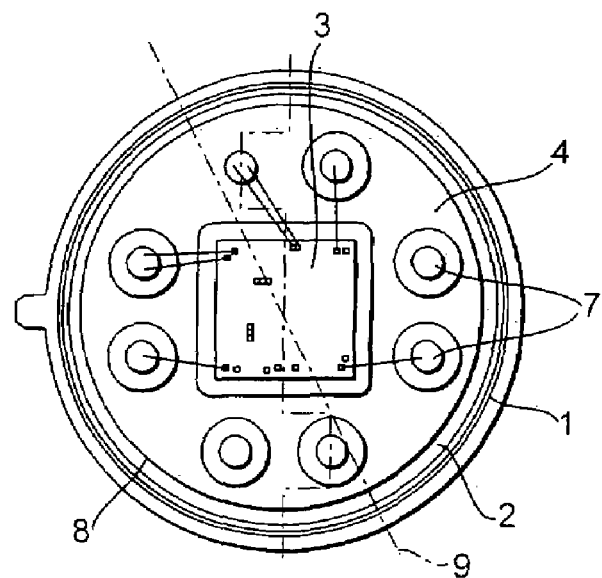
FIG. 1 shows the top view of a conventional base of a housing form for receiving a micromechanical component.

With reference to the drawings, an exemplary embodiment will be described in the following in which the advantages of the design of the base of a housing form according to the present invention are shown. Typically such housing forms are used as housings for sensors. FIG. 1 shows the top view of a conventional base 4 situated on a housing bottom 2. In this instance, sensor element 3 is situated centrally in base 4. Sensor element 3 is contacted via pins 7 through base 4. Housing cover 1 is centered circumferentially on base edge 8.

Figure 2:
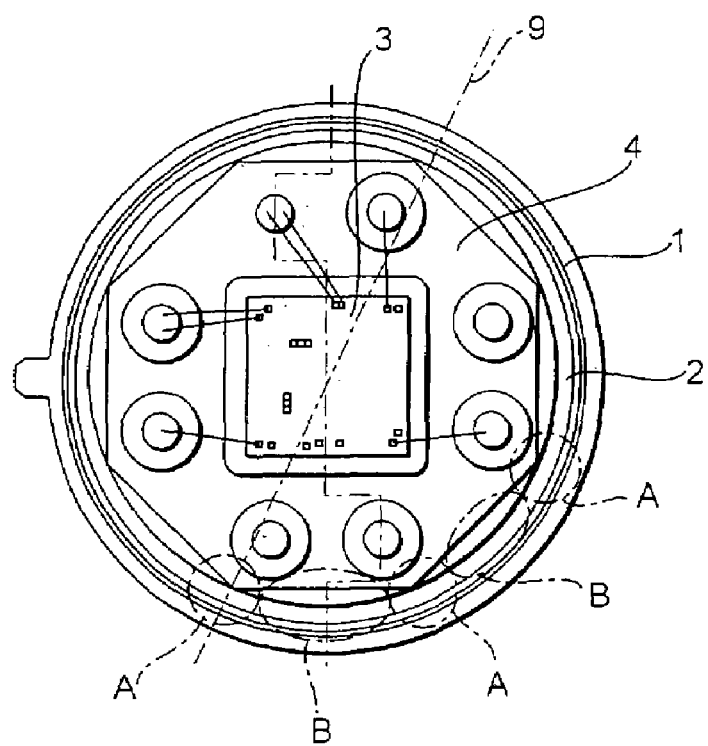
FIG. 2 shows the top view of a base modified in accordance with the present invention.
Figure 3:
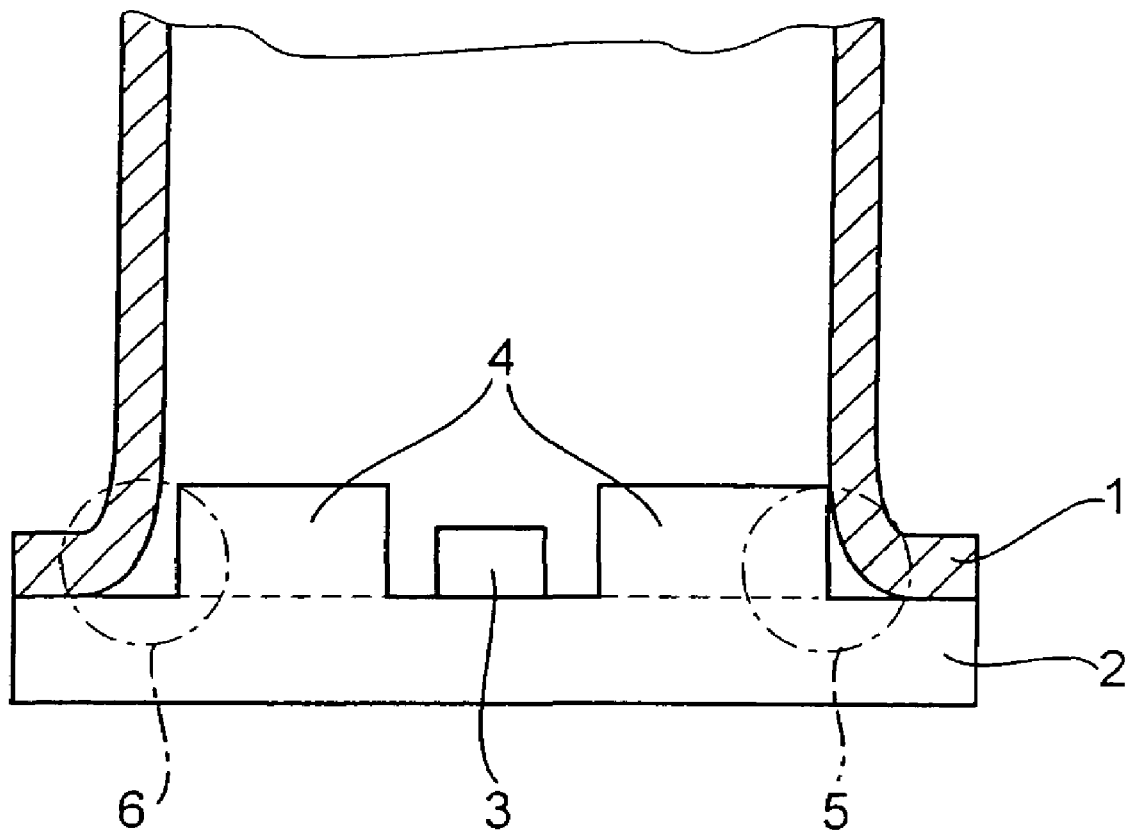
FIG. 3 shows a cross section through the housing depicting the bottom connected to the housing and the base.

A cross section 9 through housing cover 1, housing bottom 2 and base 4 is shown in FIG. 3. Here one can see that housing cover 1 is connected to housing bottom 2. Housing cover 1 is centered on housing bottom 2 via the guide of the housing wall on base 4 of housing bottom 2. Due to tolerances in the manufacturing of housing cover 1 and of base 4, the clearance between the housing wall and base 4 across the entire length of the edge of the base may be of uneven width. It is not necessary, however, as shown in FIG. 1 that the housing wall contacts base 4 across the entire edge of the base. According to the present invention, only a few contact points are required between base 8 and the housing wall, as shown in FIG. 2 in the example of an octagonal base 4, in order to achieve centering.

In a special specific embodiment of the present invention according to FIG. 2, the edge of base 4 is designed in such a way that first regions A are closer to the housing wall and second regions B are further removed from the housing wall. In FIG. 2, first regions A are designed as corners in base 4, while a different design of first regions A is also conceivable.

Housing cover 1 in this instance is centered via selected contact points in first regions A. In comparison to FIG. 1, FIG. 2 clearly shows that defined free volumes between the housing wall and base 4 are created between the contact point in first regions A. These free volumes facilitate filling the gap between the edge and the housing wall with filling material.

As cross section 9 in FIG. 3 additionally shows, the connection of the housing cover and the housing bottom creates pockets 5 and 6 between the housing wall and base 4 or housing bottom 2. If, for example, for stabilizing the connection between housing cover 1 and housing bottom 2, a filling material is introduced, then in the formation of these pockets 5 and 6 in an embodiment of base 4 according to FIG. 1 it is impossible to avoid inclusions of air and/or hollow spaces. If base 4 is designed according to the present invention as shown in FIG. 2, however, then the filling material, which is introduced for example from above between the housing wall and base 4 or housing bottom 2, will also reach these places in that pockets 5, which would otherwise not be accessible from above, are filled from the side.

Suitable sensor types, in which the design of the base (4) according to the present invention may be applied, are pressure sensors, thermal sensors, mass flow sensors, but also acceleration sensors, yaw rate sensors or rotational speed sensors. Since depending on the sensor type there must be a direct contact between the sensor element (3) and the medium surrounding the sensor, a corresponding opening may be provided in housing cover 1.

What is claimed is:

1. A method for manufacturing a device, comprising:
   providing a housing having a housing wall;
   providing a bottom connected to the housing and having at least one base, the base having an edge, wherein:
   the providing of the bottom is performed in a manner that results in formation of the edge with a first predetermined region and a second predetermined region, the first region being substantially closer to the housing wall than the second region within a single plane that is perpendicular to a central axis, the central axis extending between a top and a bottom of the housing and into the base; and
   a height of the housing wall between the top and the bottom of the housing is substantially greater than a height of the base.

2. The method as recited in claim 1, further comprising:
   filling a filling region in the second region between the base and the housing wall with a filling material containing a passivating substance.

3. The method as recited in claim 1, further comprising:
   filling a filling region in the second region between the edge of the base and the housing wall with a filling material, thereby minimizing inclusions of at least one of air and hollow spaces.

4. The method as recited in claim 1, wherein the formation of the edge with the first and second predetermined regions provides the edge with a predetermined shape, the method further comprising:
   using the shape to center the housing on the bottom.

5. A device comprising:
   a housing having a housing wall;
   a bottom connected to the housing and having at least one base, the base having an edge, wherein:
   the device is manufactured to provide the edge of the base with a first predetermined region and a second predetermined region, the first region being substantially closer to the housing wall than the second region within a single plane that is perpendicular to a central axis, the central axis extending between a top and a bottom of the housing and into the base; and
   the bottom includes a sensor element that detects and outputs an operating variable representing at least one of:
   an operating parameter of a medium adjoining the sensor element; and
   a state parameter of the sensor element; and
   pins that contact the sensor element through the base;
   wherein:
   the operating parameter includes at least one of a pressure, a pressure difference, a temperature, a density, and a flow velocity; and
   the state parameter includes at least one of a velocity, an acceleration, a rotation, and a yawing motion.

6. The device as recited in claim 5, wherein a direct contact exists between the housing wall and the base only in the first region, the base being designed as a centering base.

7. The device as recited in claim 5, further comprising:
   a filling material corresponding to a passivating substance in the second region between the edge and the housing wall.

8. The device as recited in claim 7, wherein:
   the edge is a surface that extends, in a direction perpendicular to the central axis and in planes parallel to the central axis, to surround the central axis; and
   the filling material fills all space between the edge and the housing wall that existed prior to introduction of the filling material.

9. The device as recited in claim 7, wherein:
   the filling material covers the base at least partially, such that the filling material covers the edge and a part of an upper side of the base.

10. The device as recited in claim 5, wherein the manufacturing of the edge of the base with the first and second predetermined regions provides the edge with a shape usable for centering the housing on the bottom.

11. The device as recited in claim 5, wherein the bottom includes a portion that extends radially outward beyond the edge.

12. The device as recited in claim 5, wherein the state parameter includes at least one of the velocity, the acceleration, and the yawing motion.

13. A method for manufacturing a device, comprising:
   providing a housing having a housing wall;
   providing a bottom connected to the housing and having at least one base, the base having an edge, wherein:
   the providing of the bottom is performed in a manner that results in formation of the edge with a first predetermined region and a second predetermined region, the first region being substantially closer to the housing wall than the second region within a single plane that is perpendicular to a central axis, the central axis extending between a top and a bottom of the housing and into the base; and
   the bottom includes a sensor element that detects and outputs an operating variable representing at least one of:
   an operating parameter of a medium adjoining the sensor element; and
   a state parameter of the base sensor element; and
   providing pins that contact the sensor element through the base;
   wherein:
   the operating parameter includes at least one of a pressure, a pressure difference, a temperature, a density, and a flow velocity; and the state parameter includes at least one of a velocity, an acceleration, a rotation, and a yawing motion.

14. The method as recited in claim 13, wherein the state parameter includes at least one of the velocity, the acceleration, and the yawing motion.

15. The method as recited in claim 13, further comprising:
filling a filling region in the second region between the base and the housing wall with a filling material containing a passivating substance.

16. The method as recited in claim 13, further comprising:
filling a filling region in the second region between the edge of the base and the housing wall with a filling material, thereby minimizing inclusions of at least one of air and hollow spaces.

17. The method as recited in claim 13, wherein the formation of the edge with the first and second predetermined regions provides the edge with a predetermined shape, the method further comprising:
using the shape to center the housing on the bottom.

18. A device, comprising:
a housing having a housing wall;
a bottom connected to the housing and having at least one base, the base having an edge, wherein:
the device is manufactured to provide the edge with a first predetermined region and a second predetermined region, the first region being substantially closer to the housing wall than the second region within a single plane that is perpendicular to a central axis, the central axis extending between a top and a bottom of the housing and into the base; and
a height of the housing wall between the top and the bottom of the housing is substantially greater than a height of the base.

19. The device as recited in claim 18, further comprising:
a filling material containing a passivating substance filled in a filling region of the second region between the base and the housing wall, thereby minimizing inclusions of at least one of air and hollow spaces.

* * * * *

UNITED STATES PATENT AND TRADEMARK OFFICE
CERTIFICATE OF CORRECTION

PATENT NO. : 7,637,176 B2 Page 1 of 1
APPLICATION NO. : 10/558570
DATED : December 29, 2009
INVENTOR(S) : Woersinger et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 784 days.

Signed and Sealed this

Ninth Day of November, 2010

David J. Kappos
*Director of the United States Patent and Trademark Office*